(12) United States Patent
Watanabe et al.

(10) Patent No.: US 6,255,706 B1
(45) Date of Patent: Jul. 3, 2001

(54) THIN FILM TRANSISTOR AND METHOD OF MANUFACTURING SAME

(75) Inventors: Takuya Watanabe; Hiroyuki Yaegashi, both of Kawasaki; Hideki Noto, Yonago; Tetsuya Kida, Kawasaki, all of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/477,059

(22) Filed: Jan. 3, 2000

(30) Foreign Application Priority Data

Jan. 13, 1999 (JP) .................................................. 11-007050

(51) Int. Cl.[7] ........................... H01L 29/76; H01L 29/94; H01L 31/062; H01L 31/113; H01L 31/119
(52) U.S. Cl. .............................. 257/412; 257/59; 257/72; 257/350; 257/412; 257/955; 438/155; 438/162
(58) Field of Search .................................. 257/57, 59, 72, 257/347, 350, 412, 413, 905; 438/155, 162

(56) References Cited

U.S. PATENT DOCUMENTS 5,334,860 * 8/1994 Naito .
5,518,936 * 5/1996 Yamamoto et al. .
5,831,281 11/1998 Kurogane et al. ...................... 257/57

FOREIGN PATENT DOCUMENTS 3260631 11/1991 (JP) .
764109 3/1995 (JP) .
9148586 6/1997 (JP) .

* cited by examiner

Primary Examiner—Ngân V. Ngô
(74) Attorney, Agent, or Firm—Greer, Burns & Crain, Ltd.

(57) ABSTRACT

A thin film transistor wherein at least one of (1) a gate electrode and/or a scanning line therefor and (2) source/drain electrode and/or signal lines therefor comprises a laminated wiring structure in which a main wiring layer formed of a metal selected from Al and Cu or an alloy based on the metal is sandwiched between an underlying wiring layer and an overlaying wiring layer, the underlying and overlaying wiring layers being formed of a material based on a metal or alloy of metals and containing nitrogen, the metal being selected from Ti, Mo, W, Cr, Al and Cu, and the materials used in the underlying and overlaying wiring layers being different from each other. Alternatively, the underlying and overlaying wiring layers are formed of a material based on the same metal or alloy of metals and containing nitrogen, the metal being selected from Ti, Mo, W, Cr, Al and Cu, and contents of nitrogen in the underlying and overlaying wiring layers being different from each other. A method of manufacturing such a thin film transistor is also disclosed.

19 Claims, 6 Drawing Sheets

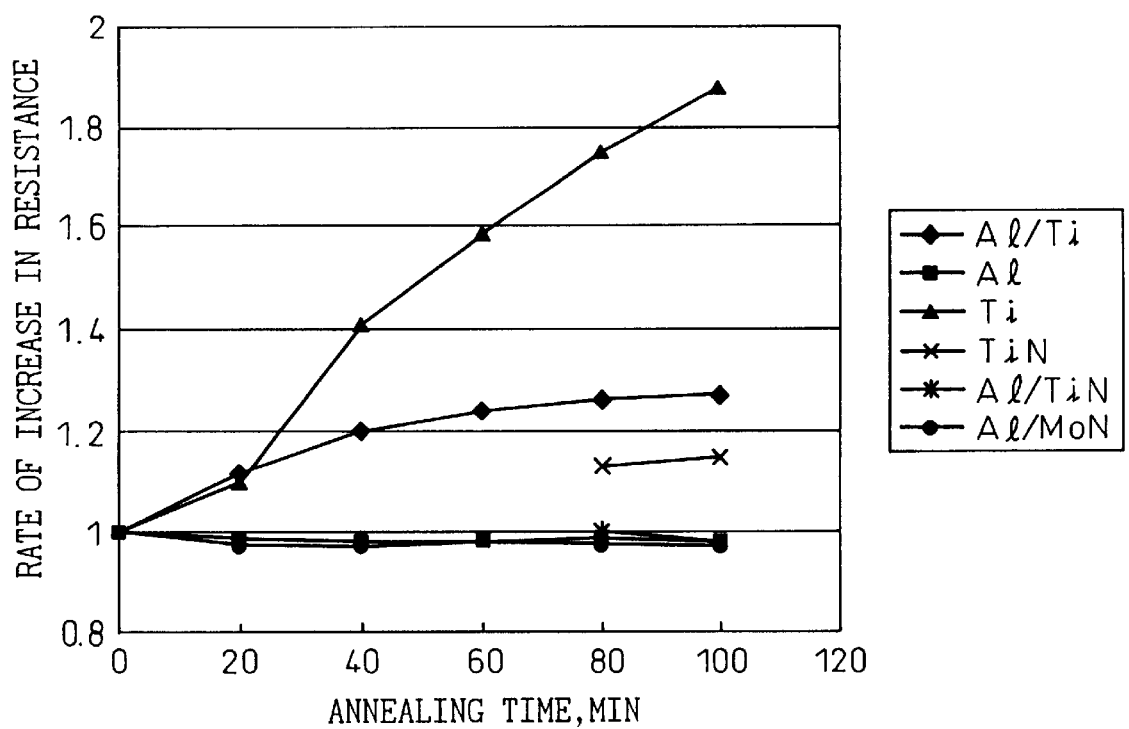

THIN FILM TRANSISTOR AND METHOD OF MANUFACTURING SAME

BACKGROUND OF THE INVENTION

1. Field of the Invention

The invention relates to a thin film transistor having an improved wiring line structure and, especially, to a thin film transistor broadly used for a liquid crystal display unit, and to a method of manufacturing the same.

2. Description of the Related Art

Recent liquid crystal display units have become larger in size and higher in definition, and wiring lines used in circuits of such a unit must have lower resistances. FIG. 1 shows a sectional structure of a thin film transistor according to prior art. A thin film transistor (hereinafter denoted as TFT) for a higher definition display unit often uses an aluminum (Al) wiring material, coping with the demand for lower resistance. By way of example, FIG. 1 shows a gate electrode 31 formed on a glass substrate 30 using such an Al wiring material 17. However, Al is prone to develop hillocks during a heat treatment in a subsequent process to deteriorate a dielectric strength of an insulation film in contact with an Al wiring line, and, consequently, to prevent this, a structure in which the Al wiring line is capped by a metal having a high melting point as indicated by 18 in the drawing, such as titanium (Ti), is generally used. In addition, when Al is used in source/drain electrodes 32 and 33, a structure is employed in which the Al layer 20 is sandwiched by a barrier layer 19 for good contact with an n+-type amorphous Si layer 22, which is a contact layer, and the prevention of the diffusion of Al, and a cap layer 21 which is also for the prevention of hillocks. The cap layer 21 is also necessary for good contact with a pixel electrode 23 of a liquid crystal display unit.

However, in such a structure, problems as shown below arise. In gate electrode 31, interdiffusion is generated, by heat treatment in a subsequent process, between the cap layer 18 of high melting point metal showing comparatively higher resistance and the Al layer 17, and a region of high resistance is formed centering n the neighbor of the interface therebetween, resulting in increase in wiring resistance. In addition, diffusion of impurities from the substrate 30 to the gate electrode 31 during the heat treatment causes dispersion of characteristics between TFTs. In order to cope with such problems, methods in which Ti containing nitrogen (hereinafter denoted as TiN) is used for the cap layer 21, and an SiO film (not shown) is formed between the substrate 30 and the Al wiring layer 17, as a block layer, are disclosed. Nevertheless, when a dry etching process is carried out, for example, overhangs are formed because TiN shows a lower etching rate than Al. This overhang causes, during subsequent formation of an insulation film on the wiring layer, deterioration of insulation performance of the insulation film by the formation of voids (cavities) on the sides of the layer of Al material underlying it. In addition, the formation of an SiO film leads to an increase in production cost because it requires a separate film forming apparatus therefor while increasing the number of steps. Also in the source/drain electrodes 32, 33, an increase in resistance occurs due to the above-mentioned interdiffusion.

In addition, although a method in which different wiring layers of a wiring line of three-layered structure are etched together by an etching liquid is economical and is used broadly, the following problems arise in this case. In general, a film formed by a plasma CVD process, such as a gate insulation film 35, tends to be cracked at portions of a change in level, as shown by dashed lines 36 in FIG. 1 and, during etching of source/drain electrodes 32, 33, an etchant penetrates through the cracks to the gate electrode layer, resulting in defects in the gate electrode layer. This is serious particularly when the gate electrode 31 and the source/drain electrode 32, 33 use the same material. Also, a structure in which an Al wiring layer is sandwiched between layers of TiN or the like is disclosed. In this case, although the problem of penetration of an etchant is avoidable because the wiring line is capable of being formed by dry etching process, the problem of an overhang configuration is unavoidable and, consequently, a degradation of the quality of the products occurs.

SUMMARY OF THE INVENTION

Taking the problems as set forth above into account, the invention aims to provide a thin film transistor which is capable of being easily manufactured, is free of an increase in resistance occurring when a material having a low resistance, such as Al or Cu, is used with the cap layer, is provided with a wiring structure having no overhang configuration, and which is also free of damage to a wiring line due to penetration of an etching liquid.

Such an object of the invention can be achieved by use of a laminated wiring structure in which a main wiring layer formed of a metal selected from Al and Cu or an alloy based on the metal is sandwiched between an underlying wiring layer and an overlaying wiring layer, the underlying and overlaying wiring layers being formed of a material based on a metal or an alloy of metals and containing nitrogen, the metal being selected from Ti, Mo, W, Cr, Al and Cu, and the materials used in the underlying and overlaying wiring layers being different from each other.

Alternatively, the above object can be achieved by use of a laminated wiring structure in which a main wiring layer formed of a metal selected from Al and Cu or an alloy based on the metals is sandwiched between an underlying wiring layer and an overlaying wiring layer, the underlying and overlaying wiring layers being formed of a material based on the same metal or alloy of metals and containing nitrogen, the metal being selected from Ti, Mo, W, Cr, Al and Cu, and contents of nitrogen in the underlying and overlaying wiring layers being different from each other.

BRIEF DESCRIPTION OF THE DRAWINGS

The above and other objects and advantages of the invention will be well understood and appreciated by a person with ordinary skill in the art, from the following detailed description and the attached drawings, wherein:

FIG. 2 is a graph showing a relation between annealing time and rates of increase in resistance of various wiring materials;

DETAILED DESCRIPTION OF THE INVENTION

Figure 1:
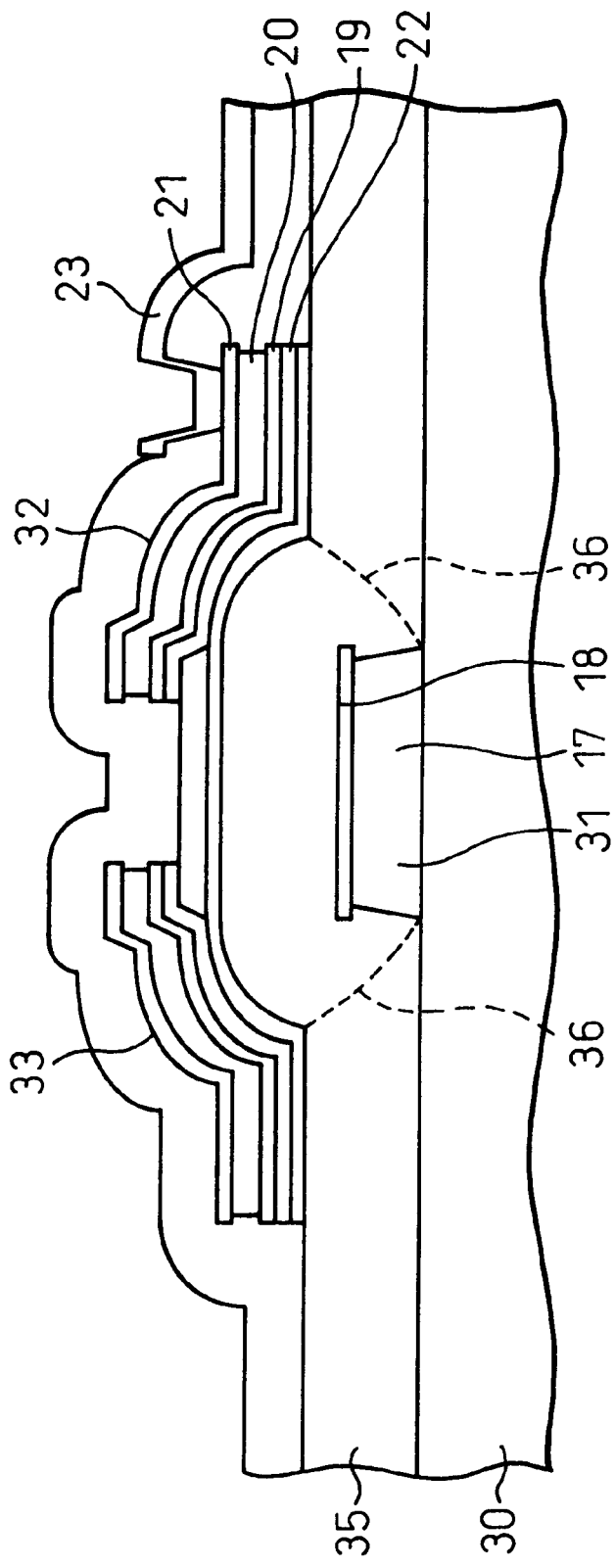
FIG. 1 illustrates a TFT according to prior art.

In the invention, any insulating substrate can be used as a substrate. For example, when a TFT of the invention is used in a liquid crystal display unit, it is appropriate to use a transparent glass substrate or the like as the insulating substrate.

The TFT of the invention is provided on such an insulating substrate with, at least, a gate electrode and a scanning line therefor, a gate insulation film, a semiconductor layer, and source/drain electrodes and signal lines therefor. An insulation film may be provided on the source/drain electrodes, as a final protective film. In addition to this, a pixel (also called picture element or picel) electrode is provided in the case of a TFT used in a liquid crystal display unit.

As indicated above, the gate electrode is connected to the scanning line. The term "gate electrode" or "gate wiring line" as used solely herein means, unless otherwise specified, a gate electrode and a wiring line (scanning line) connected thereto. In the invention, either the gate electrode or the scanning line can have the laminated structure of the invention, or both of the gate electrode and the scanning line may have the laminated structure of the invention. Similarly, the source/drain electrode is connected to the signal line. The term "source/drain electrode" or "source/drain wiring line" as used solely herein also means, unless otherwise specified, a source/drain electrode and a wiring line (signal line) connected thereto. In the invention, either the source/drain electrode or the signal line can have the laminated structure of the invention, or both of the source/drain electrode and the signal line may have the laminated structure of the invention. In addition, the term "electrode" or "wiring line" used solely herein to represent one having the laminated structure of the invention is also understood to mean, unless otherwise specified, both of an electrode and a wiring line connected thereto. The electrode (wiring line) of the laminated structure of the invention is effective in lowering resistance and, accordingly, is more advantageous to scanning and signal lines.

In the TFT of the invention, the gate electrode and/or scanning line, or the source/drain electrodes and/or signal lines, or both of them are designed to have (a) a laminated structure in which a main wiring layer formed of a metal selected from Al and Cu or an alloy based on the metal is sandwiched between an underlying wiring layer and an overlaying wiring layer, the underlying and overlaying wiring layers being formed of a material based on a metal or alloy of metals and containing nitrogen, the metal being selected from Ti, Mo, W, Cr, Al and Cu, and the materials used in the underlying and overlaying wiring layers being different from each other, or (b) a laminated structure in which a main wiring layer formed of a metal selected from Al and Cu or an alloy based on the metal is sandwiched between an underlying wiring layer and an overlaying wiring layer, the underlying and overlaying wiring layers being formed of a material based on the same metal or alloy of metals and containing nitrogen, the metal being selected from Ti, Mo, W, Cr, Al and Cu, and contents of nitrogen in the underlying and overlaying wiring layers being different from each other.

As a material for the main wiring layer, Al or an alloy of Al with one or more other metals, or Cu or an alloy of Cu with one or more other metals can be used.

On the other hand, as materials for the underlying and overlaying wiring layers sandwiching the main wiring layer and in contact therewith, materials based on a metal selected from Ti, Mo, W, Cr, Al and Cu or an alloy of the metals and containing nitrogen are used. The alloy in this case is an alloy containing mainly one of Ti, Mo, W, Cr, Al and Cu.

Furthermore, the metal or alloy of the material for each of the underlying and overlaying wiring layers must contain nitrogen. The metal or alloy thus containing nitrogen in the invention is, in general, a material which can be considered to be a nitride. It is enough for a nitrogen content in the material to be an amount useful to prevent a significant increase in resistance of a wiring line due to diffusion during heat treatment, and to be determined discretionally depending on a material used and conditions such as a temperature of heat treatment. In some cases, the underlying and/or overlaying wiring layer may partially or locally contain nitrogen, as illustrated in the example below.

A nitride of a metal such as Ti, Mo, W, Cr, Al and Cu or an alloy thereof possesses a high blocking capacity against diffusion due to heating, and accordingly, even if it is subjected to a heat treatment in a step subsequent to the formation of a gate or source/drain wiring line, the nitride makes it possible to provide a high quality wiring line which is free of an increase in resistance. FIG. 2 shows data of rates of increase in resistance of films and laminated films of various metals and nitrides after annealing at 320° C., measured at room temperature with a four-point probe specific resistance instrument.

According to the results, Ti proves to show a noticeable increase in resistance as the annealing time is elongated. This seems to be due to progress of oxidation with the lapse of time, which increased the resistance. On the other hand, Al keeps its resistance constant because its surface is oxidized but the oxidation does not extend inside. In contrast, the laminated film of Al/Ti (it was the Ti film that was exposed to air and was subjected to its oxidation effect) shows an intermediate rate of increase between those of both (Al and Ti), and has a value different from both an increased resistance value of Ti having the oxidized surface and the resistance value of Al. It has also turned out that the increase in resistance of the laminated film of Al/Ti also occurs when heated in a vacuum, and is not connected with the oxidation of Ti. In contrast with these results, it has become clear that the samples in which Al was laminated with TiN or MoN maintained their initial resistance values regardless of the heating time.

Nitrides of metals such as Ti, Mo, W, Cr, Al and Cu or alloys thereof referred to herein can have a different etching rate for a specific etchant by having a different nitrogen content. In other words, an etching rate for a specific etching liquid falls when a nitride of the metal or alloy thereof have an increased nitrogen content. Although, for dry etching, a general law such as that for the case of wet etching is not recognized between a nitrogen content and an etching rate, a certain correlation is found between a nitrogen content and an etching rate for certain metals or alloys. In addition, a selectivity of a nitride of the metal or alloy in wet etching or dry etching by a specific etchant is not different from that of the metal or alloy which the nitride is based on, and the nitride is etched also by an etchant which etches the metal or alloy. Thus, in the invention, formation of overhang is prevented by selecting quantities of overlaying, main, and underlying wiring layers etched in such a manner that a quantity of material etched of an upper layer is the same as or more than a quantity of material etched of a lower layer, by combining those characteristics.

In this way, according to the invention, thermal diffusions between the main wiring layer and the underlying and overlaying wiring layers in contact with the main wiring layer are prevented, resulting in no increased resistance of a formed wiring line, and no overhang in configuration of the formed wiring line, which makes it possible to provide a TFT having a high reliability. In addition, when laminated source/drain electrodes are formed according to the invention, an underlying wiring layer can be used as an etching stopper in the case of use of wet etching, by discretionally selecting a combination of an overlaying wiring layer and the underlying wiring layer, which makes it possible to prevent damage to a lower wiring line (gate wiring line).

Etchants for respective materials used for wiring lines of laminated structure of the invention are well-known in the art, and an etchant to be used can be selected depending on a material practically used.

In the invention, it is essential to use a wiring line comprising a three-layer structure provided with the nitrogen-containing underlying and overlaying wiring layers set forth above which are useful to block thermal diffusion, as the layers in contact with the main wiring layer formed of Al or Cu or an alloy based on one of them. Also, in this invention, the wiring line of a laminated structure may be provided with a further layer or further layers on the top of the wiring line having such a three-layer structure (i.e., on the above-described overlaying wiring layer) and/or under it (i.e., under the above-described underlying wiring layer). For example, when TFTs for a liquid crystal display unit are formed on a glass substrate, there is, depending on a manufacturing process used, a case where an amorphous silicon layer exists under signal lines connected to source/drain electrodes, and the signal line in this case has a four-layer structure in which the above-described three-layer structure is provided on the amorphous silicon layer.

As described, a laminated wiring line in a TFT of the invention may form a gate electrode or a source/drain electrode.

In the invention, various combinations are used as materials for a laminated wiring line. For example, the underlying, main, and overlaying wiring layers can respectively use a nitrogen-containing Al or its alloy, Al or an Al alloy, and a nitrogen-containing Mo or its alloy with, for example, Ti. A laminated wiring line using a nitrogen-containing Al or its alloy in the underlying wiring layer is suitable, in particular, for a gate electrode.

Also, various manners of forming the wiring line of laminated st cture of the invention are envisaged. For example, three layers constituting a laminated structure (overlaying, main, and underlying wiring layers) may be etched together by the same etchant. Alternatively, the three layers may be successively etched by respective, different etchants. Alternatively, two of the three layers may be etched by the same etchant, and the other may be etched by another etchant. As an example of the latter, reference can be made to etching the underlying and main wiring layers by the same etchant, and etching the overlaying wiring layer by another etchant. As a specific example, reference can be made to wet-etching the overlaying wiring layer of an Mo-based material and the main wiring layer of an Al-based material by a phosphoric acid-based etchant, and dry-etching the underlying wiring layer of a Ti-based material by a chlorine-based etchant. In this case, even if a wiring line of the three-layer structure of the invention is formed as a source/drain electrode, the underlying wiring layer of Ti-based material acts as an etching stopper during wet-etching, which is very advantageous in terms of making it possible to prevent an etching liquid from penetrating into a gate insulation film. Thus, if the underlying wiring layer is designed to be formed of a material capable of acting as an etching stopper during etching of the main wiring layer, the main wiring layer can be etched by wet etching and, consequently, even if the overlaying wiring layer of a Ti-based material is used, it is possible to form the main wiring layer of an Al-based material while preventing formation of an overhang of the overlaying wiring layer, and while preventing an etching liquid from penetrating into the underlying wiring layer.

The invention will now be further described by making reference to the following examples.

EXAMPLE 1

This example illustrates a TFT having a gate electrode to which the invention is applied.

Figure 3A:
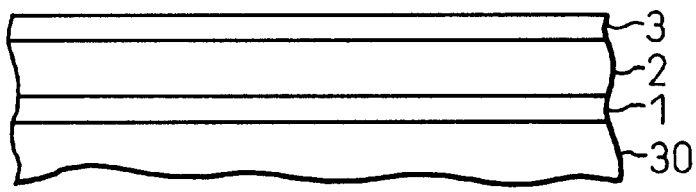
FIGS. 3A to 3D illustrate the manufacturing process in Example 1.

First, as shown in FIG. 3A, a nitrogen-containing Al layer 1 having a thickness of about 50 nm was formed on an insulating substrate 30 made of glass. The formation of this layer was carried out by use of a conventional sputtering process and introducing a mixed gas of Ar and $N_2$ at a ratio of about 4:1. On the nitrogen-containing Al layer 1 thus formed, an Al layer 2 of about 150 nm thick was further formed, and a nitrogen-containing Mo layer 3 of 50 nm thick was then formed. The formation of the nitrogen-containing Mo layer 3 was carried out by use of a conventional sputtering process and introducing a mixed gas of Ar and $N_2$ at a ratio of about 9:1.

Figure 3B:
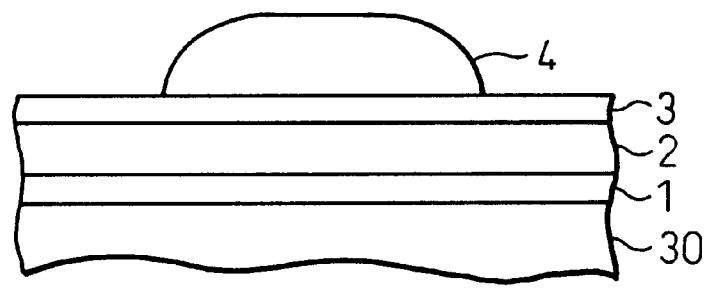
Figure 3C:
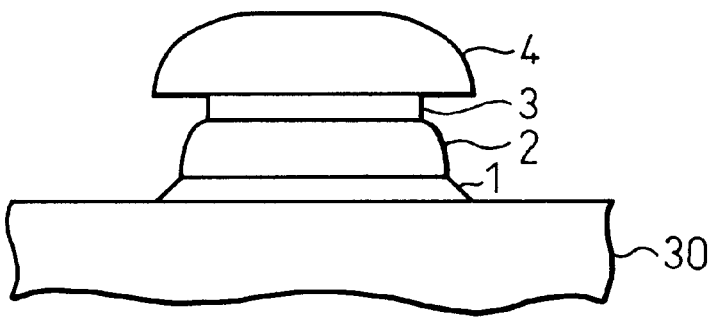

Onto the three-layered film thus formed, a resist material was applied, and was then exposed and developed, to thereby form a resist layer 4 having a desired pattern as shown in FIG. 3B. Subsequently, as shown in FIG. 3C, the three-layered film was etched using the resist layer 4 as a mask by a wet etching process. As an etching liquid, a conventional Al-etching liquid of mixed phosphoric, acetic, and nitric acids was used. Subsequently, the resist layer 4 was peeled and removed, to complete a gate electrode 40 of a three-layer structure as shown in FIG. 3D.

Figure 3D:
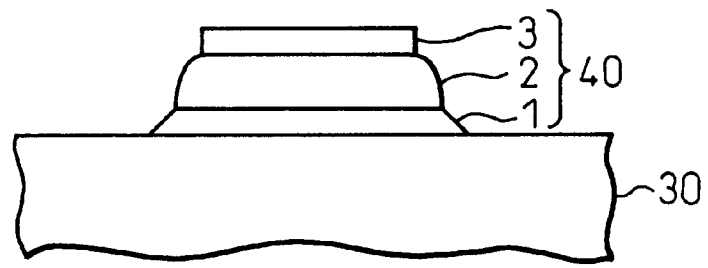

By scanning electron microscopy (SEM) of the gate electrode 40 thus formed, it was confirmed that it has a structure having step-like sides without overhang, as schematically shown in FIG. 3D. An electrical resistance of the finished gate electrode 40 was equivalent to a value for Al even after a heat treatment, as previously described with reference to FIG. 2.

EXAMPLE 2

This example illustrates another TFT having a gate electrode to which the invention is applied.

Figure 4A:
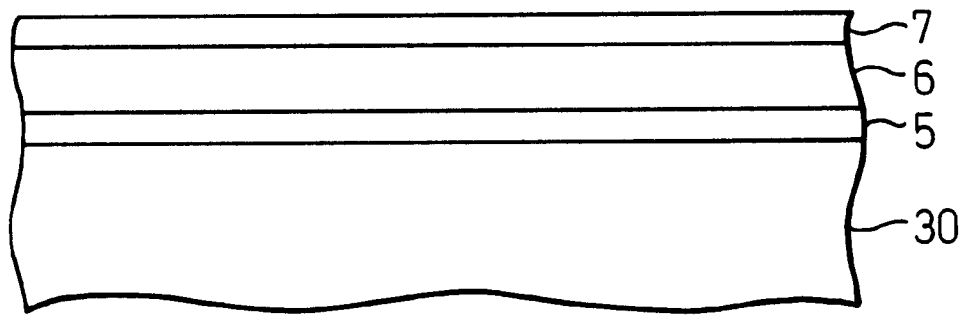
FIGS. 4A and 4B illustrate the manufacturing process in Example 2.

Herein, as shown in FIG. 4A, a nitrogen-containing Mo layer 5 having a thickness of about 50 nm was first formed. The formation of this layer was carried out by use of a conventional sputtering process and introducing a mixed gas of Ar and $N_2$ at a ratio of about 6:4. On the formed nitrogen-containing Mo layer 5, an Al layer 6 of about 150 nm thick was further formed, and a nitrogen-containing Mo layer 7 of 50 nm thick was then formed.

The formation of the nitrogen-containing Mo layer 7 was carried out by use of a conventional sputtering process and introducing a mixed gas of Ar and $N_2$ at a ratio of about 9:1. Subsequently, the formed three-layered film was patterned in the same manner as that described in Example 1, to provide a gate electrode 41 of a three-layer structure as shown in FIG. 4B.

Figure 4B:
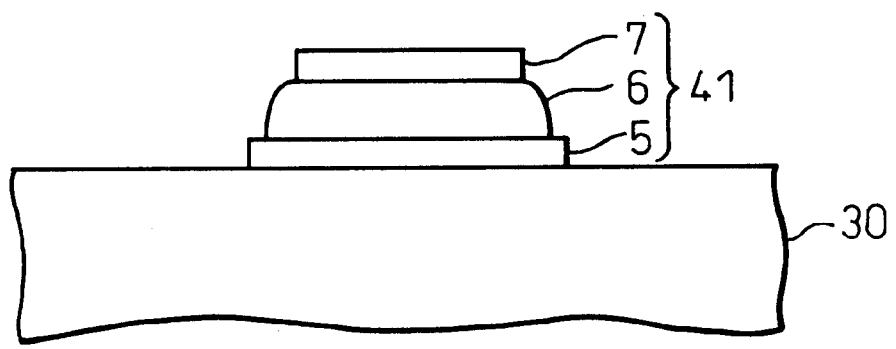

By SEM observation of the gate electrode 41 thus formed, it was confirmed that it has a structure having step-like sides without overhang, as schematically shown in FIG. 4B. An electrical resistance of the gate electrode 41 was equivalent to a value for Al even after a heat treatment.

Although Examples 1 and 2 illustrate a wiring line (gate wiring line) of three-layered structure, it is enough that layers in contact with the main wiring layer of Al, which is a low resistance layer, are layers of nitrogen-containing metal or alloy, for the purpose of preventing an increase in resistance. Furthermore, in the laminated wiring line of the invention, a further layer may exist under the nitrogen-containing underlying layer and/or on the nitrogen-containing overlaying layer, as described above.

EXAMPLE 3

This example illustrates a TFT having source/drain electrodes to which the invention is applied.

Figure 5A:
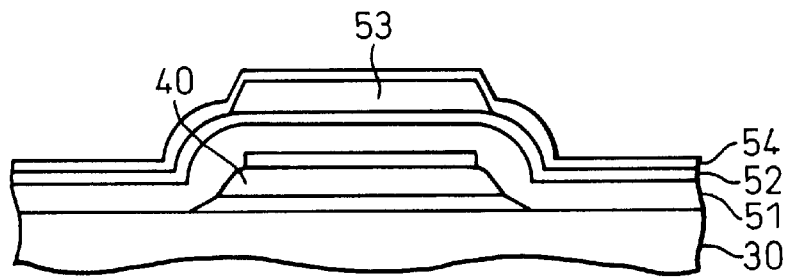
FIGS. 5A to 5C illustrate the first half of the manufacturing process in Example 3.

As shown in FIG. 5A, on a gate electrode 40 formed according to Example 1, were successively formed a gate insulation film 51 (silicon nitride film formed by a CVD process), a semiconductor layer 52 (amorphous silicon film formed by a CVD process), and a channel protection film 53 (formed by selectively removing a silicon nitride layer formed by a CVD process), and after which an amorphous Si layer 54 of n+-type, which would eventually become a contact layer, was formed. The processing steps up to the formation of the Si layer 54 can be carried out by combining Example 1 and the prior art.

Figure 5B:
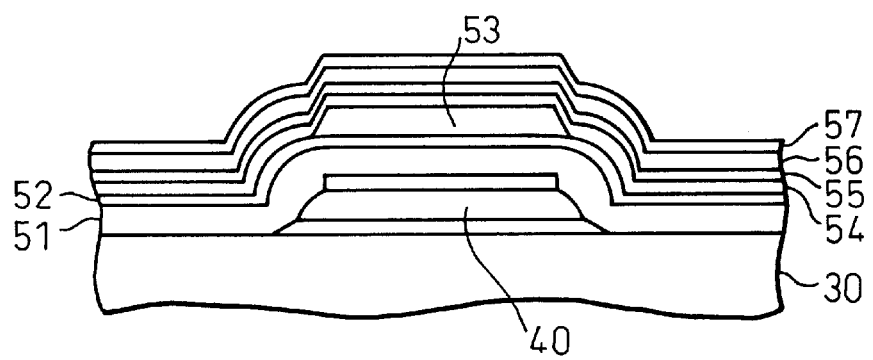
Figure 5C:
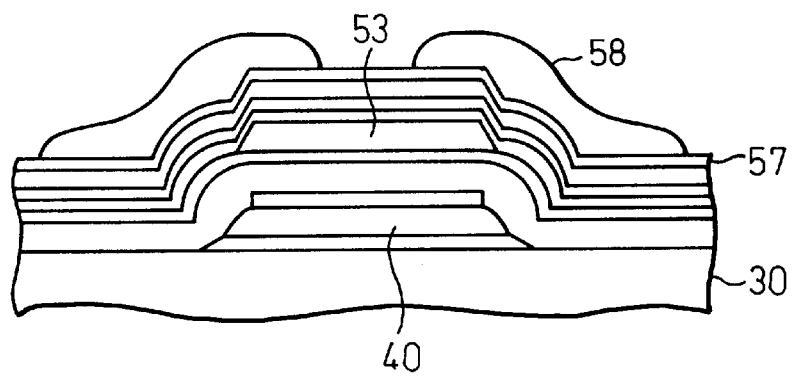

Subsequently, as shown in FIG. 5B, a Ti film 55 of about 50 nm thick was formed on the n+-type amorphous Si layer 54, the Ti film only partially containing nitrogen. The formation of this film 55 was carried out in a manner that, using a conventional sputtering process, a first 20 nm layer (not shown) of the film was formed of Ti using only Ar gas and, subsequently, a nitrogen-containing Ti layer (not shown) was formed by introducing a mixed gas of the Ar gas and $N_2$ gas at a ratio of about 1:1. On the resultant Ti layer 55 only containing partially nitrogen, an Al—Nd alloy layer 56 of about 150 nm thick was further formed by a sputtering process, and a nitrogen-containing Mo layer 57 of 50 nm thick was then formed. The formation of this nitrogen-containing Mo layer 57 was carried out by use of a conventional sputtering process, and by introducing a mixed gas of Ar and $N_2$ at a ratio of about 9:1. Subsequently, a resist material was applied onto the top nitrogen-containing Mo layer 57, and was exposed and developed, to thereby form a resist layer 58 having a desired pattern, as shown in FIG. 5C.

Figure 6A:
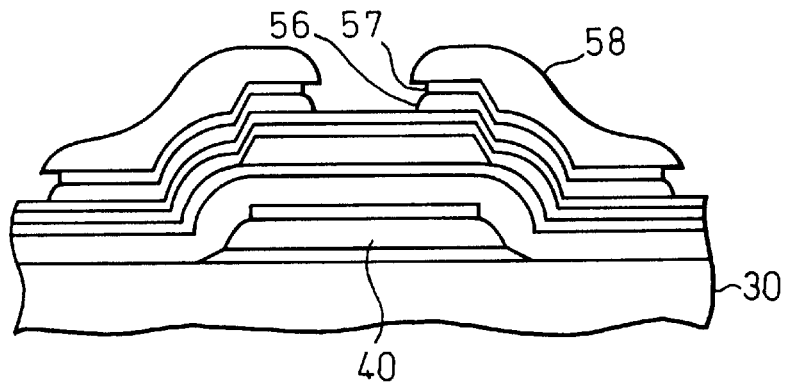
FIGS. 6A to 6C illustrate the second half of the manufacturing process in Example 3.
Figure 6B:
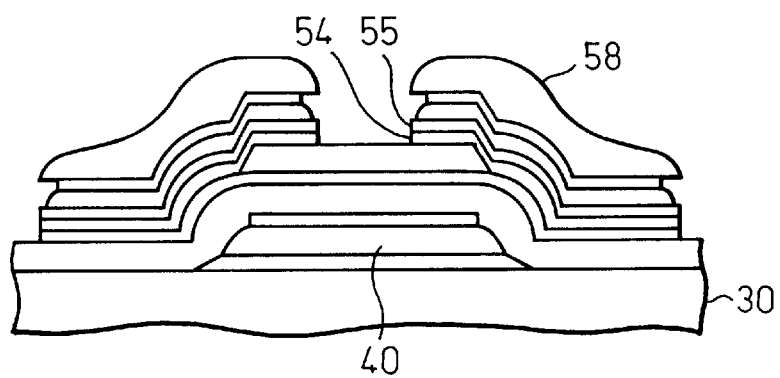
Figure 6C:
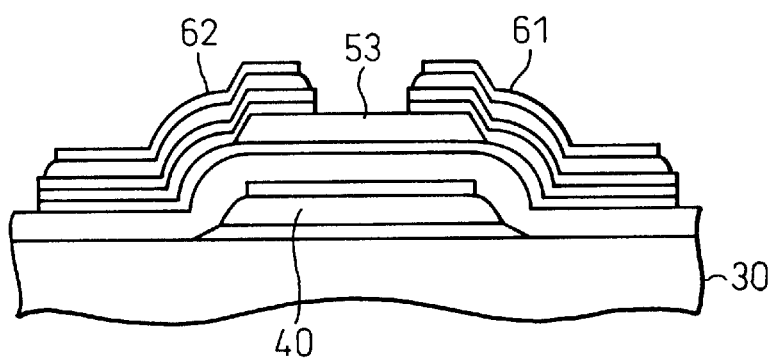

Using the resist layer 58 as a mask, wet etching was then carried out using a conventional Al-etching liquid of mixed phosphoric, acetic, and nitric acids. In this wet etching process, only the overlaying nitrogen-containing Mo layer 57 and the Al—Nd alloy layer 56 of the main wiring layer (low resistance layer) were removed, and the underlying Ti layer 55 partially containing nitrogen was not removed, as shown in FIG. 6A. The Ti layer 55 partially containing nitrogen and the n+-type amorphous Si layer 54 thereunder were then etched together by a dry etching process using a chlorine-based gas (FIG. 6B). Subsequently, the resist layer 58 was peeled and removed, to complete source/drain electrodes 61, 62 as shown in FIG. 6C. Although Al was etched by the chlorine-based gas, the Al—Nd alloy used as the material for the main wiring layer of the wiring line (source/drain wiring line) of laminated structure in this example was not etched by the chlorine-based gas by virtue of the Nd deposited on its surface, and, accordingly, the source/drain electrodes 61, 62 formed following the etching did not have an overhang configuration, as shown in the drawing.

Using, as in this example, a metal layer of an underlying layer in a source/drain electrode of laminated structure as an etching stopper during etching of a main wiring layer in a source/drain electrode, breaking of a gate wiring line due to penetration of an etching liquid into a lower layer is certainly prevented even when the main wiring layer is patterned by a wet-etching process, because a metal layer formed by a sputtering process, as the metal layer of the underlying layer in this example, does not have cracks such as those found in an insulation film formed by a CVD process. Furthermore, etching of a nitrogen-containing Ti layer used as an etching stopper is carried out simultaneously with etching of an underlying semiconductor layer, and, consequently, the number of steps involved is not increased.

Thus, in this example, the source/drain electrodes 61, 62 of low resistance having no overhangs as shown in FIG. 6C could be formed without damaging the gate layer 40.

In addition, it is also possible that a final protective film is formed on the source/drain electrodes 61, 62 in FIG. 6C, an opening is formed in the protective film, and a pixel electrode connected to the source electrode 61 through the opening is then formed, to thereby produce a TFT for liquid crystal display unit having a general structure as described with reference to FIG. 1. Processes for the formation of such a final protective film as well as a pixel electrode are well known in the art, and is unnecessary to describe them herein in more detail.

Although, in the above example, the invention was illustrated with reference to a TFT of reversed-stagger channel-protected type, it would be easily appreciated that the invention can be applied to a reversed-stagger channel-etched type TFT as well as a TFT of a stagger type.

As described, according to the invention, a wiring structure having a low resistance and no overhang can be obtained, and, additionally, diffusion of impurities from a glass substrate can be prevented in a gate wiring line, and source/drain electrodes which do not damage a gate wiring line located therebelow can also be formed. Accordingly, the invention can prevent lowered TFT driving capacity due to increased wiring line resistance and decreased reliability due to defective etched configuration in a liquid crystal display unit having a higher definition, to thereby greatly contribute to an improvement in its quality and reliability.

What is claimed is:

1. A thin film transistor provided, on an insulating substrate, at least with a gate electrode and a scanning line connected thereto, a gate insulation film, a semiconductor layer, and source/drain electrodes and signal lines connected thereto, wherein at least one of (1) the gate electrode and/or the scanning line and (2) the source/drain electrodes and/or the signal lines comprises a laminated wiring structure in which a main wiring layer formed of a metal selected from Al and Cu or an alloy based on the metal is sandwiched between an underlying wiring layer and an overlaying wiring layer, the underlying and overlaying wiring layers being formed of a material based on a metal or alloy of metals and containing nitrogen, the metal being selected from Ti, Mo, W, Cr, Al and Cu, and the materials used in the underlying and overlaying wiring layers being different from each other.

2. The thin film transistor of claim 1, wherein the gate electrode and/or the scanning line comprises said laminated wiring structure, and a material for the main wiring layer is Al, a material for the underlying wiring layer is a nitrogen-containing Al, and a material for the overlaying wiring layer is a nitrogen-containing Mo.

3. The thin film transistor of claim 1, wherein the source/drain electrodes and/or the signal lines comprises said laminated wiring structure, and a material for the main wiring layer is an Al—Nd alloy, a material for the underlying wiring layer is a nitrogen-containing Ti, and a material for the overlaying wiring layer is a nitrogen-containing Mo.

4. The thin film transistor of claim 2, wherein the source/drain electrodes and/or the signal lines comprises said laminated wiring structure, and a material for the main wiring layer is an Al—Nd alloy, a material for the underlying wiring layer is a nitrogen-containing Ti, and a material for the overlaying wiring layer is a nitrogen-containing Mo.

5. The thin film transistor of claim 1, wherein the underlying and/or overlaying wiring layer partially contains nitrogen.

6. A thin film transistor provided, on an insulating substrate, at least with a gate electrode and a scanning line connected thereto, a gate insulation film, a semiconductor layer, and source/drain electrodes and signal lines connected thereto, wherein at least one of (1) the gate electrode and/or the scanning line and (2) the source/drain electrodes and/or the signal lines comprises a laminated wiring structure in which a main wiring layer formed of a metal selected from Al and Cu or an alloy based on the metal is sandwiched between an underlying wiring layer and an overlaying wiring layer, the underlying and overlaying wiring layers being formed of a material based on the same metal or alloy of metals and containing nitrogen, the metal being selected from Ti, Mo, W, Cr, Al and Cu, and contents of nitrogen in the underlying and overlaying wiring layers being different from each other.

7. The thin film transistor of claim 6, wherein the gate electrodes and/or the scanning line comprises said laminated wiring structure, and a material for the main wiring layer is Al, and a material for the underlying and overlaying wiring layers is nitrogen-containing Mo.

8. The thin film transistor of claim 6, wherein the underlying and/or overlaying wiring layer partially contains nitrogen.

9. A method of manufacturing a thin film transistor provided, on an insulating substrate, at least with a gate electrode and a scanning line connected thereto, a gate insulation film, a semiconductor layer, and source/drain electrodes and signal lines connected hereto, wherein at least one of (1) the gate electrode and/or the scanning line and (2) the source/drain electrodes and/or the signal lines comprises a laminated wiring structure in which a main wiring layer formed of a metal selected from Al and Cu or an alloy based on the metal is sandwiched between an underlying wiring layer and an overlaying wiring layer, the underlying and overlaying wiring layers being formed of a material based on a metal or alloy of metals and containing nitrogen, the metal being selected from Ti, Mo, W, Cr, Al and Cu, and the materials used in the underlying and overlaying wiring layers being different from each other, the method comprising steps of successively forming films of materials for the underlying, main, and overlaying wiring layers of the laminated wiring structure, and patterning the resultant laminated films to thereby form the wiring layers of laminated structure.

10. The method of claim 9, wherein the laminated films are patterned together by the same etchant.

11. The method of claim 9, wherein the overlaying and main wiring layers are patterned together by wet etching, and the underlying wiring layer is then patterned by dry etching.

12. The method of claim 9, wherein the gate electrode and/or the scanning line comprises said laminated wiring structure, and a material for the main wiring layer is Al, a material for the underlying wiring layer is a nitrogen-containing Al, and a material for the overlaying wiring layer is a nitrogen-containing Mo.

13. The method of claim 9, the source/drain electrodes and/or the signal lines comprises said laminated wiring structure, and a material for the main wiring layer is an Al—Nd alloy, a material for the underlying wiring layer is a nitrogen-containing Ti, and a material for the overlaying wiring layer is a nitrogen-containing Mo.

14. The method of claim 12, the source/drain electrodes and/or the signal lines comprises said laminated wiring structure, and a material for the main wiring layer is an Al—Nd alloy, a material for the underlying wiring layer is a nitrogen-containing Ti, and a material for the overlaying wiring layer is a nitrogen-containing Mo.

15. The method of claim 9, wherein the underlying and/or overlaying wiring layer partially contains nitrogen.

16. A method of manufacturing a thin film transistor provided, on an insulating substrate, at least with a gate electrode and a scanning line connected thereto, a gate insulation film, a semiconductor layer, and source/drain electrodes and signal lines connected thereto, wherein at least one of (1) the gate electrode and/or the scanning line and (2) the source/drain electrodes and/or the signal lines comprises a laminated wiring structure in which a main wiring layer formed of a metal selected from Al and Cu or an alloy based on the metal is sandwiched between an underlying wiring layer and an overlaying wiring layer, the underlying and overlaying wiring layers being formed of a material based on the same metal or alloy of metals and containing nitrogen, the metal being selected from Ti, Mo, W, Cr, Al and Cu, and contents of nitrogen in the underlying and overlaying wiring layers being different from each other, the method comprising steps of successively forming films of materials for the underlying, main, and overlaying wiring layers of the laminated wiring structure, and patterning the resultant laminated films to thereby form the wiring layers of laminated structure.

17. The method of claim 16, wherein the laminated films are patterned together by the same etchant.

18. The method of claim 16, wherein the overlaying and main wiring layers are patterned together by wet etching, and the underlying wiring layer is then patterned by dry etching.

19. The method of claim 16, wherein the gate electrode and/or the scanning line comprises said laminated wiring structure, and a material for the main wiring layer is Al, and a material for the underlying and overlaying wiring layers is a nitrogen-containing Mo.

* * * * *